US009875971B2

(12) United States Patent
Bhushan et al.

(10) Patent No.: US 9,875,971 B2
(45) Date of Patent: Jan. 23, 2018

(54) MAGNETIC SHIELDING OF MRAM PACKAGE

(71) Applicant: GLOBALFOUNDRIES Singapore Pte. Ltd., Singapore (SG)

(72) Inventors: Bharat Bhushan, Singapore (SG); Juan Boon Tan, Singapore (SG); Wanbing Yi, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 44 days.

(21) Appl. No.: 15/080,541

(22) Filed: Mar. 24, 2016

(65) Prior Publication Data

US 2016/0284981 A1 Sep. 29, 2016

Related U.S. Application Data

(60) Provisional application No. 62/138,413, filed on Mar. 26, 2015.

(51) Int. Cl.
*H01L 43/12* (2006.01)
*H01L 29/82* (2006.01)
(Continued)

(52) U.S. Cl.
CPC .......... *H01L 23/552* (2013.01); *H01L 23/295* (2013.01); *H01L 24/29* (2013.01); *H01L 21/486* (2013.01); *H01L 21/563* (2013.01); *H01L 24/05* (2013.01); *H01L 24/06* (2013.01); *H01L 24/16* (2013.01); *H01L 24/32* (2013.01); *H01L 24/33* (2013.01); *H01L 24/73* (2013.01); *H01L 24/92* (2013.01); *H01L 24/94* (2013.01); *H01L 24/97* (2013.01); *H01L 2224/0401* (2013.01);
(Continued)

(58) Field of Classification Search
CPC ........ H01L 43/02; H01L 43/12; H01L 23/552
See application file for complete search history.

(56) References Cited

U.S. PATENT DOCUMENTS 7,545,662 B2 6/2009 Wang et al.
7,772,679 B2 * 8/2010 Chang .................. H01L 23/552 257/435

(Continued)

*Primary Examiner* — Matthew Landau
*Assistant Examiner* — Scott Stowe
(74) *Attorney, Agent, or Firm* — Horizon IP Pte Ltd.

(57) ABSTRACT

Magnetic random access memory (MRAM) packages with magnetic shield protections and methods of forming thereof are presented. Package contact traces are formed on the first major surface of the package substrate and package balls are formed on the second major surface of the package substrate. A die having active and inactive surfaces is provided on the first major surface of the package substrate. The die includes a magnetic storage element, such as an array of magnetic tunnel junctions (MTJs), formed in the die, die microbumps formed on the active surface. The package includes a top magnetic shield layer formed on the inactive surface of the die. The package may also include a first bottom magnetic shield in the form of magnetic shield traces disposed below the package contact traces. The package may further include a second bottom magnetic shield in the form of magnetic permeable underfill dielectric material. The package may also include a third bottom magnetic shield sandwiched between two thin package substrate layers of the package substrate.

19 Claims, 11 Drawing Sheets

(51) Int. Cl.

| | |
|---|---|
| ***H01L 23/552*** | (2006.01) |
| ***H01L 23/29*** | (2006.01) |
| *H01L 21/48* | (2006.01) |
| *H01L 21/56* | (2006.01) |
| *H01L 23/00* | (2006.01) |

(52) U.S. Cl.

CPC ............... *H01L 2224/05624* (2013.01); *H01L 2224/0613* (2013.01); *H01L 2224/0616* (2013.01); *H01L 2224/06135* (2013.01); *H01L 2224/06136* (2013.01); *H01L 2224/131* (2013.01); *H01L 2224/16227* (2013.01); *H01L 2224/16235* (2013.01); *H01L 2224/16238* (2013.01); *H01L 2224/2919* (2013.01); *H01L 2224/2929* (2013.01); *H01L 2224/2936* (2013.01); *H01L 2224/29355* (2013.01); *H01L 2224/29393* (2013.01); *H01L 2224/32225* (2013.01); *H01L 2224/32245* (2013.01); *H01L 2224/33181* (2013.01); *H01L 2224/33505* (2013.01); *H01L 2224/73204* (2013.01); *H01L 2224/73253* (2013.01); *H01L 2224/92225* (2013.01); *H01L 2224/92242* (2013.01); *H01L 2224/94* (2013.01); *H01L 2224/97* (2013.01); *H01L 2924/10253* (2013.01); *H01L 2924/1434* (2013.01); *H01L 2924/1435* (2013.01); *H01L 2924/15311* (2013.01)

(56) References Cited

U.S. PATENT DOCUMENTS

| | | | | |
|---|---|---|---|---|
| 8,796,046 | B2 | 8/2014 | Chen et al. | |
| 2012/0193737 | A1 | 8/2012 | Pang et al. | |
| 2015/0243607 | A1* | 8/2015 | Jang | H01L 24/73 438/113 |
| 2015/0333018 | A1* | 11/2015 | Kim | H01L 23/552 257/422 |

* cited by examiner

MAGNETIC SHIELDING OF MRAM PACKAGE

CROSS-REFERENCE TO RELATED APPLICATION

This application claims the priority benefit of U.S. Provisional Application Ser. No. 62/138,413, filed on Mar. 26, 2015, and this application cross-references to U.S. patent application Ser. No. 15/080,562, concurrently filed on Mar. 24, 2016, the disclosures of which are hereby incorporated by reference in their entireties for all purposes.

BACKGROUND

Magnetic random access memory (MRAM) is a non-volatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information. For example, READ and WRITE operations of the MRAM device rely on the MTJ element. However, magnetic interferences can be a problem for MRAM devices. For instance, MTJ functions can be affected by an external magnetic field. The external magnetic field may come from sources of magnetic flux such as power lines, bar magnets, or the earth. The external magnetic fields not only distort magnetic signals within the MTJ memory, but also induce changes on electrical signals of the circuits. READ and WRITE operations in MRAM devices are inevitably affected by external magnetic fields. These cause reliability issues in MRAM devices.

Therefore, it is desirable to provide semiconductor assembly packages having magnetic shield protections against external magnetic interferences.

SUMMARY

The disclosure generally relates to magnetic shielding of MRAM packages. In one embodiment, a method for forming a MRAM package is disclosed. The method includes providing a package substrate having first and second major surfaces. The package substrate includes a plurality of through-hole contacts extend from the first to the second major surface of the package substrate. Package contact traces are formed on the first major surface and package balls are formed on the second major surface of the package substrate. The through-hole contacts couple the package contact traces and package balls on the first and second major surfaces of the package substrate. A die having active and inactive surfaces is provided. The die includes a magnetic storage element formed in the die, a plurality of die microbumps formed on the active surface and a top magnetic shield layer formed on the inactive surface of the die. The die is mounted to a die attach region defined on the first major surface of the package substrate. The die microbumps of the die are coupled to the package contact traces formed on the first major surface of the package substrate.

In another embodiment, a method for forming a MRAM package is presented. The method includes providing a wafer having first and second major surfaces. The wafer is prepared with a plurality of dies having magnetic storage elements therein and a plurality of die microbumps disposed on the first major surface of the wafer. The wafer is processed. The processing of the wafer includes separating the wafer into a plurality of individual dies. An individual die includes active and inactive surfaces. The die microbumps are formed on the active surface of the die and a top magnetic shield layer is formed on the inactive surface of the die. A package substrate having first and second major surfaces is provided. The package substrate includes a plurality of through-hole contacts extend from the first to the second major surface of the package substrate. Package contact traces are formed on the first major surface and package balls are formed on the second major surface of the package substrate. The through-hole contacts couple the package contact traces on the first and second major surfaces of the package substrate. The die is mounted to a die attach region defined on the first major surface of the package substrate. The die microbumps of the die are coupled to the package contact traces formed on the first major surface of the package substrate.

In yet another embodiment, a MRAM package is disclosed. The MRAM package includes a package substrate having first and second major surfaces. The package substrate includes a plurality of through-hole contacts extend from the first to the second major surface of the package substrate. Package contact traces are disposed on the first major surface and package balls are disposed on the second major surface of the package substrate. The through-hole contacts couple the package contact traces on the first and second major surfaces of the package substrate. The MRAM package includes a die having active and inactive surfaces. The die includes a magnetic storage element formed in the die, a plurality of die microbumps formed on the active surface and a top magnetic shield layer formed on the inactive surface of the die. The die is mounted to a die attach region defined on the first major surface of the package substrate. The die microbumps of the die are coupled to the package contact traces disposed on the first major surface of the package substrate.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
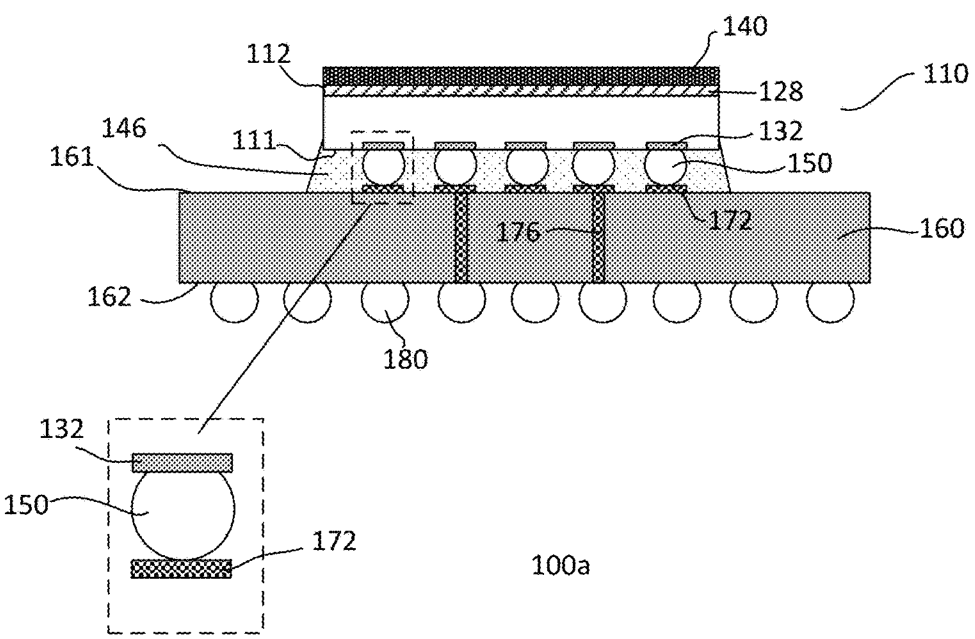
FIGS. 1*a*-1*d* show various embodiments of MRAM packages with different magnetic shielding protections.

Embodiments generally relate to semiconductor packages and methods for forming thereof. Semiconductor packages are used to package one or more semiconductor dies. The die, for example, includes a memory device forming a MRAM package. The MRAM package as will be described later in this disclosure includes one or more magnetic shield protection layers disposed on different locations of the package that protect the magnetic storage element, such as in-plane MTJ element, of the MRAM package against external magnetic interferences to prevent disturbance or change of spins in the magnetic storage element of the MRAM package. The MRAM package may also include other suitable types of devices. For the case of more than one die in the MRAM package, the dies may be arranged in a planar or side-by-side arrangement, vertical arrangement, or a combination thereof. Such packages may be incorporated into electronic products or equipment, such as phones, computers as well as mobile and mobile smart products. Incorporating the packages into other types of products may also be useful.

FIGS. 1$a$-1$d$ show various embodiments of a MRAM assembly or a MRAM package 100$a$. Referring to FIG. 1$a$, the MRAM package includes a package substrate 160. The package substrate may serve as a medium for coupling at least one die to an external substrate or circuit board. The package substrate, in one embodiment, is formed of various types of materials, including organic material, such as Bismaleimide Triazine (BT) or polyimide. Other suitable types of material, such as but not limited to laminate substrate, may be used to form the package substrate. The package substrate includes first and second major surfaces 161 and 162. The first surface 161, for example, may be referred to as the "top surface" and the second surface 162, for example, may be referred to as the "bottom surface". Other designations for the surfaces may also be useful. In one embodiment, the top surface includes a die attach region on which a die is attached.

For simplicity, the built-up layers of the package substrate are not shown. The top surface of the package substrate is provided with conductive traces or package contact traces 172 for connections to a MRAM die using bump on trace (BOT) technology. The traces may be formed of a conductive material, including copper (Cu) or Cu alloy. Other suitable conductive materials are also useful.

Package contacts or package balls 180 may be disposed on the bottom surface of the package substrate as external package contacts. The package contacts 180 may be in the form of, for example, spherical shaped structures, balls or bumps. The package contacts may be formed of a conductive material. For example, the package contacts may be formed of solders, such as lead-based or non lead-based solders. Other suitable conductive materials may also be used. The package contacts may be arranged in any suitable manner, including a regular ball grid array pattern. Arranging the package contacts in other patterns such as a non-regular pattern or providing other types of package contacts are also useful.

Continuing with FIG. 1$a$, the package substrate 160 includes a plurality of via holes, such as through-holes extending from the top surface 161 to the bottom surface 162 of the package substrate. The through-holes may be filled with a conductive material to form through-hole contacts 176. The conductive material, for example, may be Cu or other suitable conductive material. The through-hole contacts provide electrical connections between the conducive traces on the top surface of the package substrate and package balls on the bottom surface of the package substrate while the conductive traces provided on the top surface of the package substrate allow re-routing and electrical connection with the MRAM die through bump on trace.

The MRAM assembly or package 100$a$, as shown, includes a die 110. The die is mounted to a die attach region defined on the top surface of the package substrate. The die, for example, is a singulated die of a wafer processed with a plurality of dies in parallel. The die has first and second surfaces. One of the surfaces may be an active surface 111 having one or more active components defined thereon while the other surface may be an inactive surface 112. The die, for example, is a MRAM die which includes a magnetic memory component therein. The magnetic memory component, for example, includes an array of magnetic tunnel junction (MTJ) bits or elements. The MTJ bit or element, in one embodiment, includes an in-plane MTJ element of which magnetic orientation in the magnetic layers of the MTJ element is parallel to the surface of a die substrate or in-plane with the magnetic layers of the MTJ element. Other suitable magnetic-based storage element may also be useful.

In one embodiment, the die 110 is a flip chip. As shown in FIG. 1$a$, the first surface (active surface) 111 of the die is provided with die bump/bond pads 132 and die microbumps 150. The die bond pad, for example, includes a conductive material, such as aluminum (Al). Other suitable conductive materials may also be useful. The die microbumps, for example, may include contact bumps. The die microbumps 150 may be in the form of, for example, spherical shaped structures, balls or bumps. The die microbumps may be formed of solder or other types of conductive materials. The die microbumps may be arranged in various layout designs, for example, in a regular grid array arrangement. Other suitable contact structure patterns may also be used. For example, the die microbumps may be arranged in one or more rows disposed at about the center of the die or rows at the sides of the die or in a non-regular array.

As described, the top surface of the package substrate is provided with conductive traces while the bottom surface of the package substrate is provided with package balls. In the case of a flip chip, the pattern of the traces 172 is configured to match the pattern of the die microbumps 150 of the flip chip. The die microbumps of the flip chip are mated to the top package contact traces. The bottom package balls are coupled to the die microbumps of the flip chip, for example, by the through-hole contacts and conductive traces on the top surface of the package substrate.

In one embodiment, the second surface (inactive surface) 112 of the die is provided with a magnetic shield layer 140. In a flip chip coupling, the second surface (inactive surface) refers to the surface of the die which is away or distal from the package substrate. The magnetic shield layer is separated from the inactive surface of the die by a dielectric layer 128 which includes an adhesive or silicon nitride. Other suitable dielectric material which provides adhesion and isolates the magnetic shield layer from the die may also be useful. The magnetic shield layer, for example, includes a planar magnetic shield layer disposed over the inactive surface of the die. The magnetic shield layer, in one embodiment, includes a thickness of about 100-300 μm. Other suitable thicknesses may also be useful. The magnetic shield layer, in one embodiment, includes a magnetic shield material. The magnetic shield layer, for example, includes, NiFe (Mμ metal) or electrical steel. Other suitable magnetic shield material which does not function by excluding a magnetic field from itself, but rather by collecting and concentrating the magnetic field lines into itself and thereby diverting the field from the magnetically sensitive components to be protected may also be used as the magnetic shield layer. The magnetic shield layer disposed on the backside or inactive surface of the die protects the sensitive components, such as the MTJ storage element, from in-plane interferences of external magnetic fields.

As shown in FIG. 1*a*, the mating of the flip chip die to the package substrate leaves a space between the active surface of the die and top surface of the package substrate. In one embodiment, the space may be left unfilled (not shown). In other embodiments, an underfill 146 is provided in the space between the active surface 111 of the die and top surface 161 of the package substrate. The underfill, for example, may be a capillary underfill. The underfill, for example, may include an epoxy-based polymeric material. Other suitable types of underfill and underfill materials may also be useful.

Figure 1B:
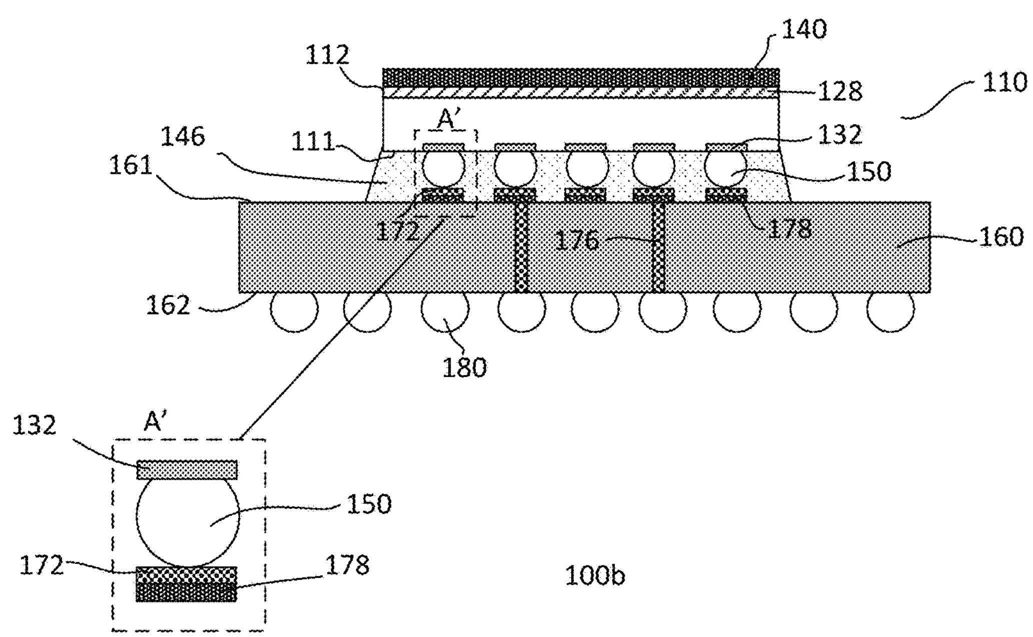

FIG. 1*b* shows another embodiment of a MRAM assembly or package 100*b*. The MRAM package as shown in FIG. 1*b* is similar to the MRAM package as shown in FIG. 1*a*. For example, similar to the MRAM assembly 100*a* in FIG. 1*a*, the MRAM package 100*b* also includes a die having a magnetic shield layer 140 disposed on the second surface 112 of the die. Common elements or features having the same reference numerals may not be described or described in detail. In the interest of brevity, the description of the MRAM package 100*b* below primarily focuses on the difference(s) compared with the MRAM package 100*a* shown in FIG. 1*a*.

In one embodiment, the MRAM package 100*b* includes magnetic shield traces 178 disposed under the top package contact traces 172 on the first surface 161 of the package substrate 160. Such configuration of having a magnetic shield trace disposed under the top package contact traces is illustrated in greater detail by a portion A' of the MRAM package. As shown, the die microbump 150 of the die is coupled to the top package contact trace 172 having a magnetic shield trace 178 under the top package contact trace. The magnetic shield trace 178, for example, includes a planar magnetic shield trace layer having a thickness, for example, of about 100-300 μm disposed over the top surface 161 of the package substrate. Other suitable thicknesses may also be useful. The magnetic shield traces 178, for example, may include the same magnetic shield material as the magnetic shield layer 140 as described in FIG. 1*a*. Providing the magnetic shield traces 178 having a different magnetic shield material than the magnetic shield layer 140 may also be useful. As shown, the magnetic shield traces disposed on the front side (or top surface) of the package substrate and the magnetic shield layer disposed on the back side (or inactive surface) of the die protect the sensitive components of the die, such as the MTJ storage element, from in-plane interferences of external magnetic fields.

Figure 1C:
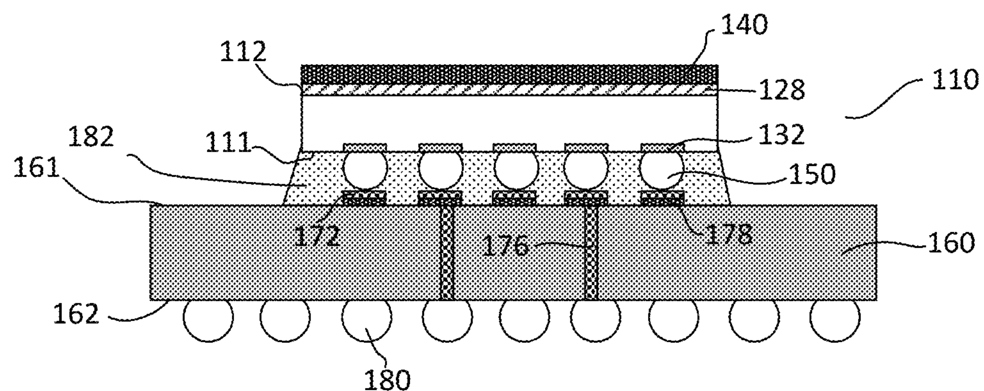

FIG. 1*c* shows another embodiment of a MRAM assembly or package 100*c*. The MRAM package 100*c* as shown in FIG. 1*c* is similar to the MRAM packages 100*a*-100*b* as shown in FIGS. 1*a*-1*b*. As such, common elements or elements having the same reference numerals may not be described or described in detail. In the interest of brevity, the description of the MRAM package 100*c* below primarily focuses on the difference(s) compared with the MRAM packages 100*a*-100*b* shown in FIGS. 1*a*-1*b*.

The MRAM package 100*c*, in one embodiment, differs from the MRAM packages 100*a*-100*b* in that the MRAM package 100*c* includes a magnetic permeable underfill dielectric material 182 disposed in between the die and package substrate. The magnetic permeable underfill dielectric material 182, in one embodiment, is provided in the space or gap between the first surface (active surface) 111 of the die and first surface (top surface) 161 of package substrate. The permeability of magnetic material varies with the type of alloy and combination. Different materials have different saturation levels. For example, an iron/nickel compound typically has twice the constant relative permeability as mere iron. The permeability also varies with particle size generally diminishing with increasing particle size. For example, barium-ferrite nanoparticles $Ba(CoTi)_xFe_{12-2x}O_{19}$ or a silicon carbide filler such as ECCOSORB® DSF has higher purity crystalline and smaller particle size which gives higher permeability property and may be used as the magnetic permeable underfill dielectric material 182. Other suitable types of magnetic permeable underfill dielectric materials may also be useful.

As shown, the magnetic permeable underfill dielectric material between the die and the package substrate, the magnetic shield traces disposed on the front side of the package substrate and the magnetic shield layer disposed on the back side of the die protect the sensitive components of the die, such as the MTJ storage element, from in-plane interferences of external magnetic fields.

Figure 1D:
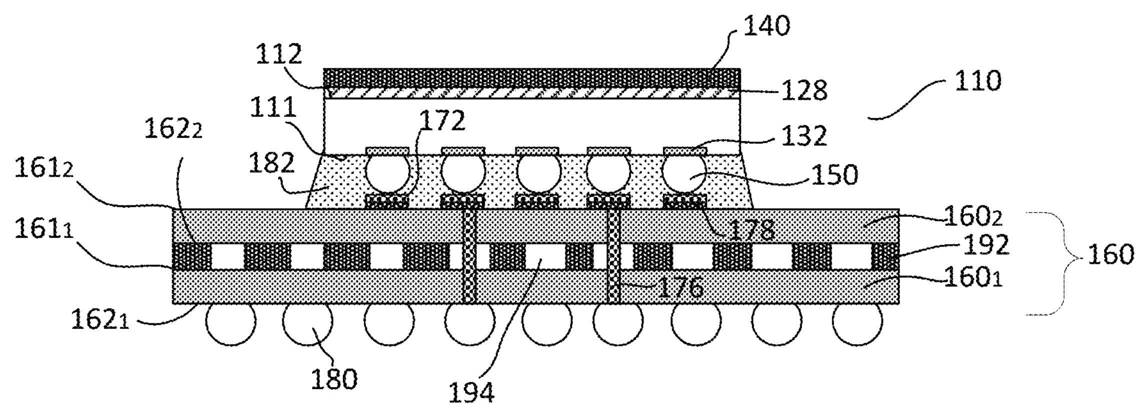

FIG. 1*d* shows another embodiment of a MRAM assembly or package 100*d*. The MRAM package 100*d* as shown in FIG. 1*d* is similar to the MRAM packages 100*a*-100*c* as shown in FIGS. 1*a*-1*c*. As such, common elements or elements having the same reference numerals may not be described or described in detail. In the interest of brevity, the description of the MRAM package 100*d* below primarily focuses on the difference(s) compared with the MRAM packages 100*a*-100*c* shown in FIGS. 1*a*-1*c*.

Similar to the MRAM assemblies 100*a*-100*c* shown in FIGS. 1*a*-1*c*, the MRAM package 100*d* includes a die 110 having a magnetic shield layer 140 disposed on the second surface 112 of the die while the first surface 111 of the die is coupled with the first surface 161 of package substrate 160. The die microbumps of the die are disposed over the top package contact traces 172 having magnetic shield traces 178 disposed under the top package contact traces. As shown, a magnetic permeable underfill dielectric material 182 as described in FIG. 1*c* may be disposed between the die and the package substrate. Alternatively, an underfill material 146, such as that described in FIGS. 1*a*-1*b*, may be disposed in between the die and the package substrate.

Referring to FIG. 1*d*, the package substrate 160 of the semiconductor assembly or package 100*d*, in one embodiment, includes a multilayered package substrate or a laminate package substrate. The multilayered substrate, for example, includes first and second package substrate layers $\mathbf{160}_1$ and $\mathbf{160}_2$. The multilayered substrate may also include other suitable number of package substrate layers. The first and second package substrate layers may be made of the same or different materials. For example, the package substrate layers are formed of various types of materials, including organic material, such as Bismaleimide Triazine (BT) or polyimide, each having a thickness of about 150-250 μm. Other suitable types of package substrate material and suitable thicknesses for the package substrate layer may also be useful.

For illustration purpose, the first package substrate layer $160_1$ is disposed on the bottom while the second package substrate $160_2$ is on the top. Alternatively, the first package substrate $160_1$ may also be on the top while the second package substrate $160_2$ may be on the bottom. The first package substrate layer includes first and second major surfaces $161_1$ and $162_1$ while the second package substrate layer includes first and second major surfaces $161_2$ and $162_2$. The first major surface (top surface) $161_2$ of the second package substrate layer, for example, is coupled with the die 110 while the second major surface (bottom surface) $162_1$ of the first package substrate layer is coupled with the external package balls 180 which are to be coupled with an external circuit board (not shown).

For simplicity, the built-up layers of the first and second package substrate layers are not shown. The first major surface of the second package substrate layer $161_2$ is provided with conductive traces and the second major surface of the first package substrate layer $162_1$ is provided with package balls. The second package substrate layer, as shown, is provided with top package contact traces 172 with underlying magnetic shield traces 178 while the first package substrate layer is provided with the package balls 180 disposed on the bottom surface.

In one embodiment, a magnetic shield layer 192 is disposed in between the first and second package substrate layers. The first and second package substrate layers with the magnetic shield layer sandwiched between them form the package substrate 160. The magnetic shield layer 192 disposed between the first and second package substrate layers, for example, may include the same magnetic shield material as the magnetic shield layer 140. Providing the magnetic shield layer 192 with magnetic shield material different than the magnetic shield layer 140 may also be useful.

Referring to FIG. 1*d*, the magnetic shield layer 192 includes a plurality of via holes filled with insulating dielectric material, forming dielectric vias 194. As shown, the package substrate 160 includes a plurality of through-holes extending from the top surface $161_2$ of the second substrate layer to the bottom surface $162_1$ of the first substrate layer of the package substrate. The through-holes may be filled with a conductive material to form through-hole contacts 176. The conductive material, for example, may be Cu or other suitable conductive material. The through-hole contacts provide electrical coupling between the top package contact traces and the bottom package balls. In one embodiment, the through-hole contacts extend from the top surface to the bottom surface of the package substrate and pass through the dielectric vias 194. As shown, the dielectric vias isolate the through-hole contacts from the magnetic shield layer 192 to prevent electrical shorts.

The magnetic shield layer in between the package substrate layers, the magnetic permeable underfill dielectric material between the die and the package substrate, the magnetic shield traces coupled to the active side of the die and the magnetic shield layer disposed on the back side or inactive surface of the die protect the sensitive components in the die, such as the MTJ storage element, from in-plane interferences of external magnetic fields.

FIGS. 2*a*-2*e* show an embodiment of a process 200 for forming a MRAM assembly or package. The MRAM assembly or package formed by process 200 is similar to the MRAM assembly 100*a* as described in FIG. 1*a*. Common elements, indicated by the same reference numerals, may not be described or described in detail.

Figure 2A:
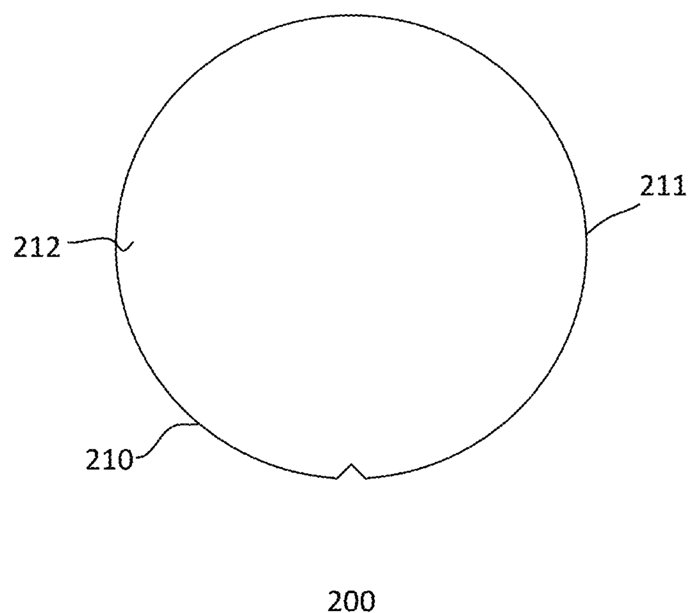
FIGS. 2*a*-2*e* show an embodiment of a process for forming a MRAM package having a top magnetic shield.

FIG. 2*a* shows a simplified plan view of a portion of an embodiment of a semiconductor wafer 210. The semiconductor wafer, for example, may be a silicon wafer. Other suitable types of wafers are also useful. For example, the wafer may be a p-type or n-type doped wafer. The wafer includes a first major surface 211 and a second major surface 212. The first major surface 211 of the wafer, for example, includes a plurality of devices formed thereon. The first major surface having the plurality of devices defined thereon may be referred to as the front side or active surface of the wafer. As for the second major surface 212 of the wafer, no devices are defined thereon and may be referred to as the back side or inactive surface of the wafer as shown in FIG. 2*a*.

In one embodiment, the wafer 210 is at the stage where front-end-of-line (FEOL) and back-end-of-line (BEOL) processing have been completed. The plurality of devices may be formed on the first major surface of the wafer in parallel. The devices, for example, are arranged in rows along a first (x) direction and columns along a second (y) direction (not shown in FIG. 2*a*). A device, for example, includes a main device region and a frame or perimeter region. The main region includes features formed by FEOL processing and interconnections formed by BEOL processing. In one embodiment, the device formed is a magnetic memory device or MRAM die having magnetic memory component defined in the main region. The magnetic memory component, for example, includes an array of magnetic tunnel junction (MTJ) bits or elements and is sensitive to external magnetic field. As for the perimeter region, it surrounds the main region. The perimeter region, for example, serves as the scribe lanes or dicing channels on the wafer, separating adjacent devices. In one embodiment, the wafer 210 is processed up to the stage where die bump/bond pads 132 are defined on the front side of the wafer and die microbumps 150 are provided and coupled to the die bond pads using suitable techniques.

Figure 2B:
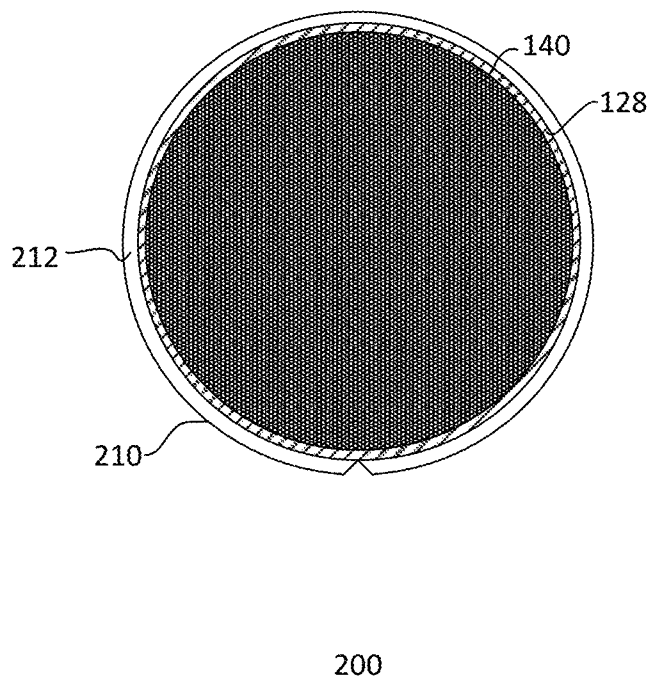

Referring to FIG. 2*b*, the process 200 continues wafer thinning followed by depositing a dielectric layer 128 on the back side or inactive surface 212 of the wafer. The dielectric layer, for example, includes an adhesive or a silicon nitride layer. The adhesive or silicon nitride may be deposited by chemical vapor deposition (CVD). In one embodiment, a magnetic shield layer 140 is deposited over the dielectric layer 128. The magnetic shield layer, for example, is deposited over the inactive surface of the wafer. The magnetic shield layer, in one embodiment, includes a magnetic shield material. The magnetic shield layer, for example, includes, NiFe (Mμ metal) or electrical steel. Other suitable magnetic shield material which does not function by excluding a magnetic field from itself, but rather by collecting and concentrating the magnetic field lines into itself and thereby diverting the field from the magnetically sensitive components to be protected may also be used as the magnetic shield layer. The magnetic shield layer, for example, may be deposited by physical vapor deposition (PVD) to form a thickness of about 100-300 μm. Alternatively, a combination of PVD and plating may be employed to form a thicker magnetic shield layer. Other suitable forming techniques and thicknesses for the magnetic shield layer may also be useful.

Figure 2C:
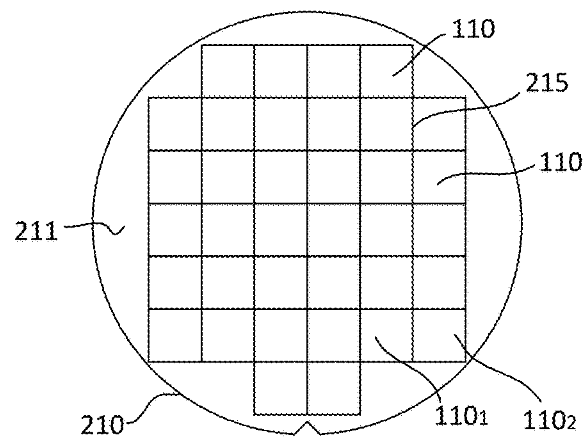
Figure 2D:
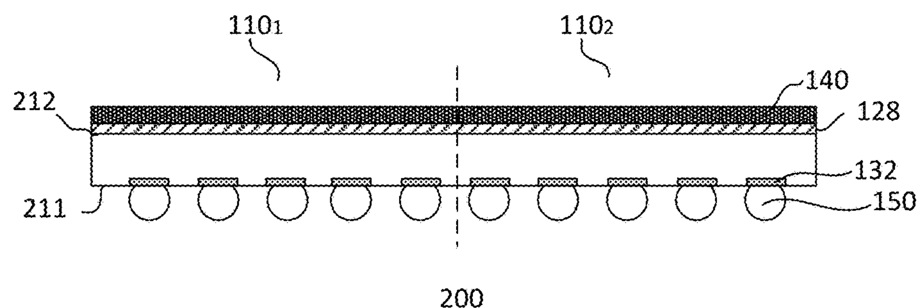

After forming the magnetic shield layer on the backside of the wafer, the process 200 may continue to flip the wafer such that the front side (or active surface) 211 of the wafer faces upward. FIG. 2*c* shows the front side 211 of the wafer 210 which includes the plurality of dies or devices 110 as described above while FIG. 2*d* shows cross-sectional view of adjacent dies of the wafer. Illustratively, two adjacent dies $\mathbf{110}_1$ and $\mathbf{110}_2$ are shown in FIG. 2*d*. It is understood that there could be other suitable number of dies. In one embodiment, a singulation process is performed through the dicing channels of the wafer. The singulation process may be achieved by mechanical sawing or other suitable techniques. The singulation process separates the wafer into individual dies 110 through the dicing channels 215.

Figure 2E:
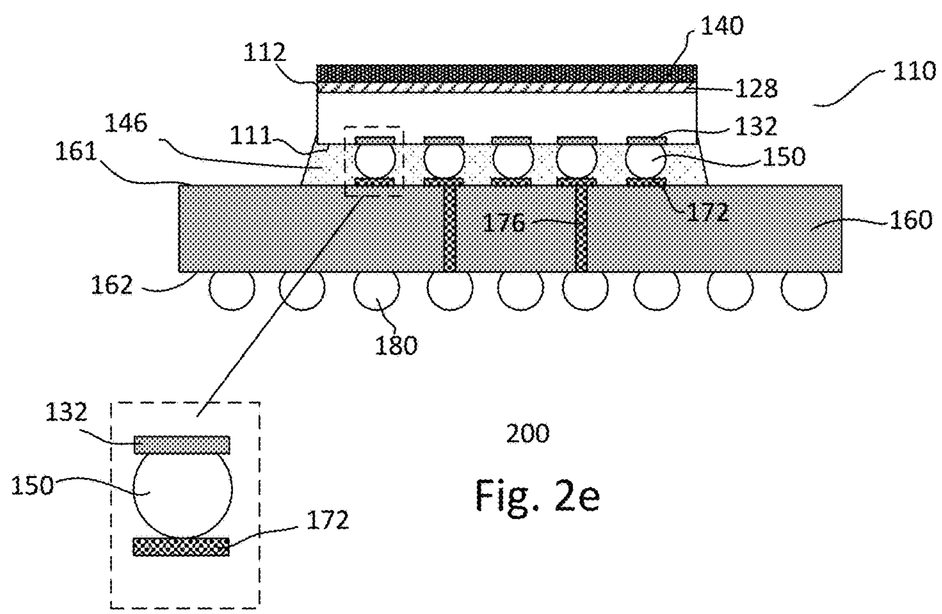

Referring to FIG. 2*e*, a package substrate 160 which is similar or the same as that described in FIG. 1*a* is provided. As shown, the process 200 continues to mount the individual or singulated die 110 to the package substrate 160 to form a MRAM package. The die 110, as shown, is the die singulated from the singulation process described in FIG. 2*d* and is a flip chip which is the same as that described in FIG. 1*a*. For example, the individual or singulated die includes a dielectric layer 128 and a magnetic shield layer 140 disposed over the back side (or inactive surface) 112 of the die while the front side (or active surface) 111 of the die is provided with die bump/bond pads 132 and die microbumps 150. The die, as shown, is picked up using a pick-and-place machine and then attached to a die attach region defined on the top surface 161 of the package substrate 160. The pattern of the top package contact traces 172 formed over the top surface of the package substrate is configured to match the pattern of the die microbumps of the flip chip. For example, the die microbumps are mated to the top package contact traces as shown in FIG. 2*e*. The package balls 180 formed at the bottom surface 162 of the package substrate are coupled to the die microbumps, for example, through the through-hole contacts 176 and conductive traces or package contact traces 172 on the top surface of the package substrate.

After the die is attached to the die attach region of the package substrate, a reflow process may be performed, forming connections between the die and the package substrate. As shown, mating of the flip chip to the package substrate leaves a space between the active surface of the flip chip and top surface of package substrate. In one embodiment, the space may be left unfilled (not shown). In other embodiments, an underfill 146 is dispensed into the space between the active surface 111 of the die and the top surface 161 of package substrate. Any suitable type of underfill may be used, including but not limited to capillary underfill. The underfill, for example, may be an epoxy-based polymeric material. Other suitable underfill materials may also be useful.

FIGS. 3*a*-3*f* show another embodiment of a process 300 for forming a MRAM assembly or package. The process 300, for example, is similar to the process as described in FIGS. 2*a*-2*e* and the MRAM assembly or package formed by process 300 is similar to the MRAM assembly 100*a* as described in FIG. 1*a*. Common elements, indicated by the same reference numerals, may not be described or described in detail. In the interest of brevity, the description of the process 300 below primarily focuses on the difference(s) compared with the process 200 shown in FIGS. 2*a*-2*d*.

Figure 3A:
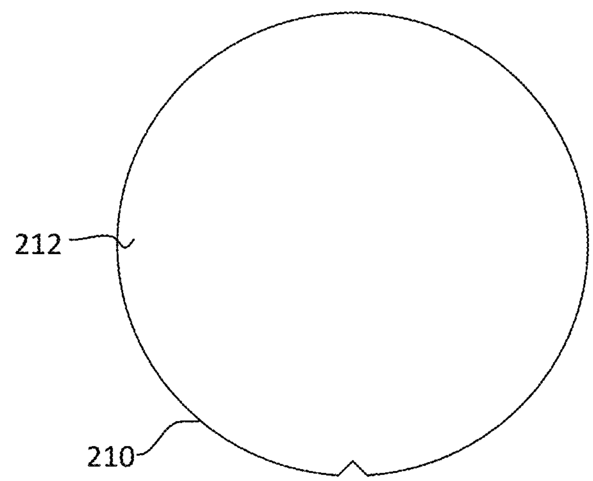
FIGS. 3*a*-3*f* show another embodiment of a process for forming a MRAM package having a top magnetic shield.

FIG. 3*a* shows a simplified plan view of a portion of an embodiment of a semiconductor wafer 210. The semiconductor wafer 210 is the same as that shown and described in FIG. 2*a*. For example, the back side (or inactive surface) 212 of the wafer is shown and the wafer 210 is processed up to the stage where die bump/bond pads 132 are defined on the front side of the wafer and die microbumps 150 are provided and coupled to the die bump/bond pads using suitable techniques.

Figure 3B:
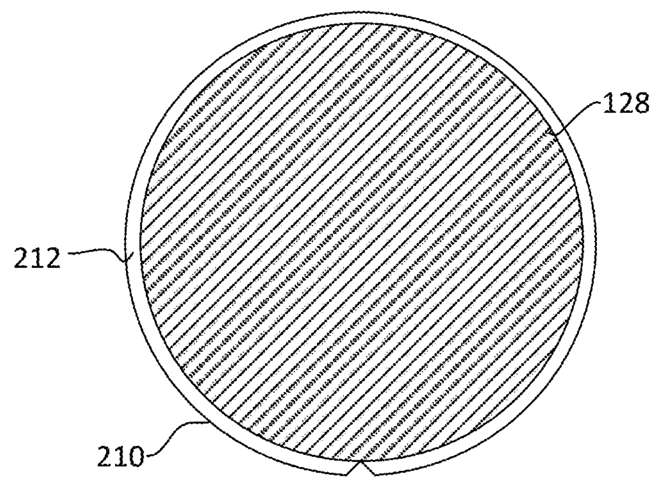

Referring to FIG. 3*b*, the process 300 continues by wafer thinning followed by depositing a dielectric layer 128 on the back side (or inactive surface) 212 of the wafer. The dielectric layer 128, for example, includes an adhesive or a silicon nitride layer. The adhesive or silicon nitride may be deposited by CVD.

Figure 3C:
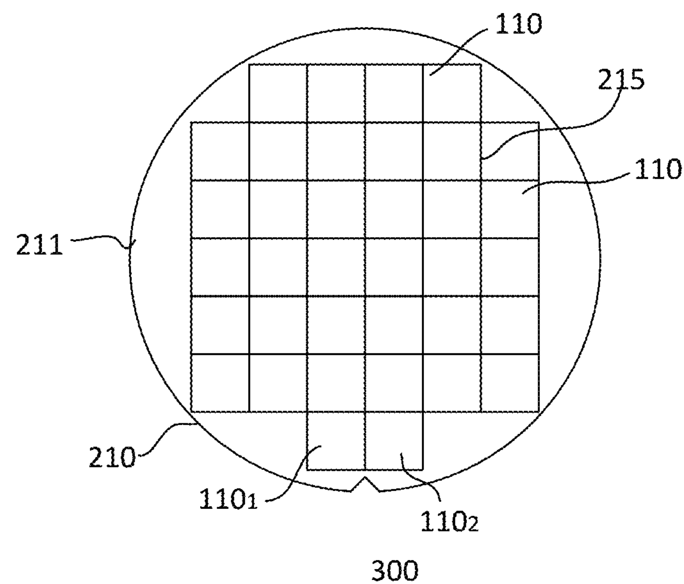
Figure 3D:
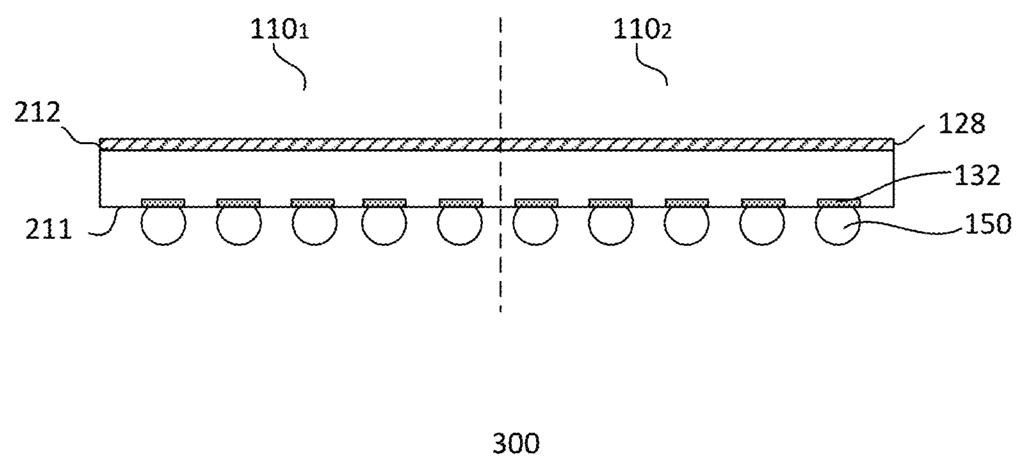
Figure 3E:
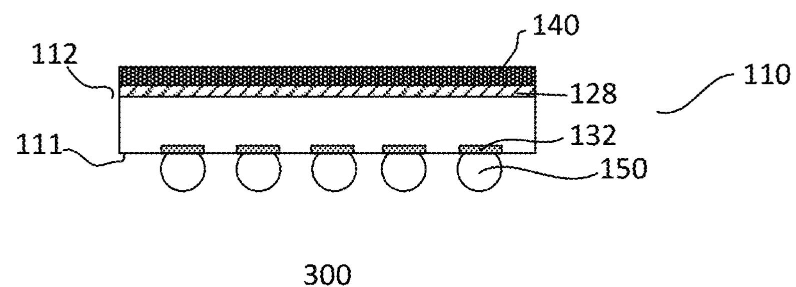
Figure 3F:
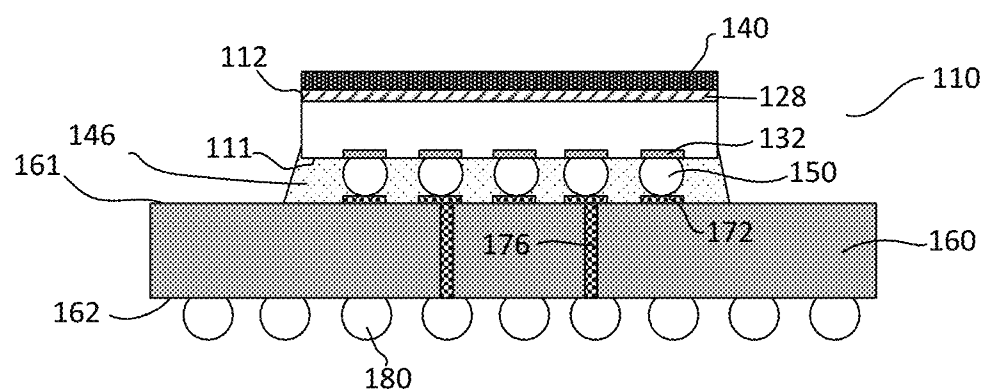

After depositing the dielectric layer 128 on the back side of the wafer, the process 300 may continue to flip the wafer such that the front side 211 of the wafer faces upward. FIG. 3*c* shows the front side of the wafer 210 which includes the plurality of dies or devices 110 while FIG. 3*d* shows cross-sectional view of adjacent dies $\mathbf{110}_1$ and $\mathbf{110}_2$ of the wafer. Illustratively, two adjacent dies are shown in FIG. 3*d*. The devices 110 are similar to that described in FIGS. 2*c* and 2*d*. As shown in FIG. 3*d*, the dielectric layer 128 which includes an adhesive or silicon nitride formed at the back side of the wafer is exposed at this stage.

In one embodiment, a singulation process is performed through the dicing channels of the wafer. The singulation process may be achieved by mechanical sawing or other suitable techniques. The singulation process separates the wafer into individual dies 110 through the dicing channel. The individual or singulated dies include the dielectric layer formed on the back side of the die.

After the singulation process is performed, the process 300 continues by providing a magnetic shield layer 140 over the dielectric layer 128 formed on the back side (or inactive surface) 112 of the singulated die 110. The magnetic shield layer 140 formed on the back side of the singulated die includes the same material and is formed by mechanically attaching the magnetic shield layer 140 with the help of the adhesive or silicon nitride 128.

The process 300 may continue by mounting the individual or singulated die 110 to a package substrate 160 such that the die microbumps 150 are coupled to the top package contact traces 172 disposed on the top surface of the package substrate. In one embodiment, an underfill 146 is dispensed into the space between the active surface 111 of the die and the top surface 161 of package substrate. The steps of mounting the die to the package substrate and dispensing the underfill material are the same as that described in FIG. 2*e* and will not be repeated therein.

Figure 4A:
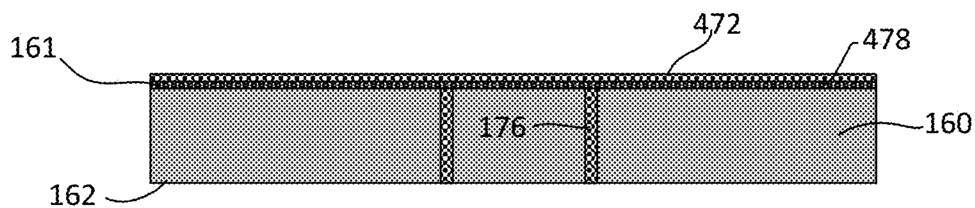
FIGS. 4*a*-4*c* show yet another embodiment of a process for forming a MRAM package having a first bottom magnetic shield in the form of magnetic shield traces, and also the top magnetic shield.
Figure 4B:
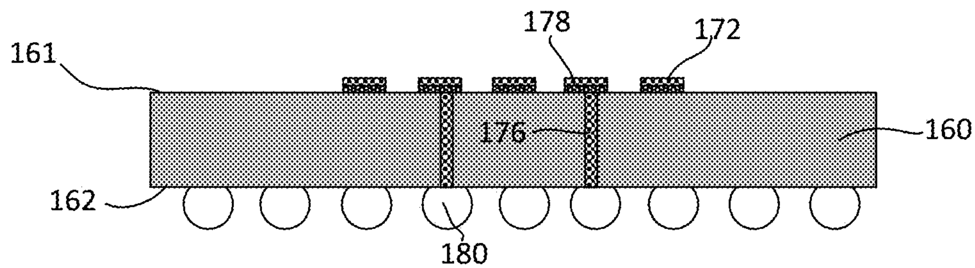
Figure 4C:
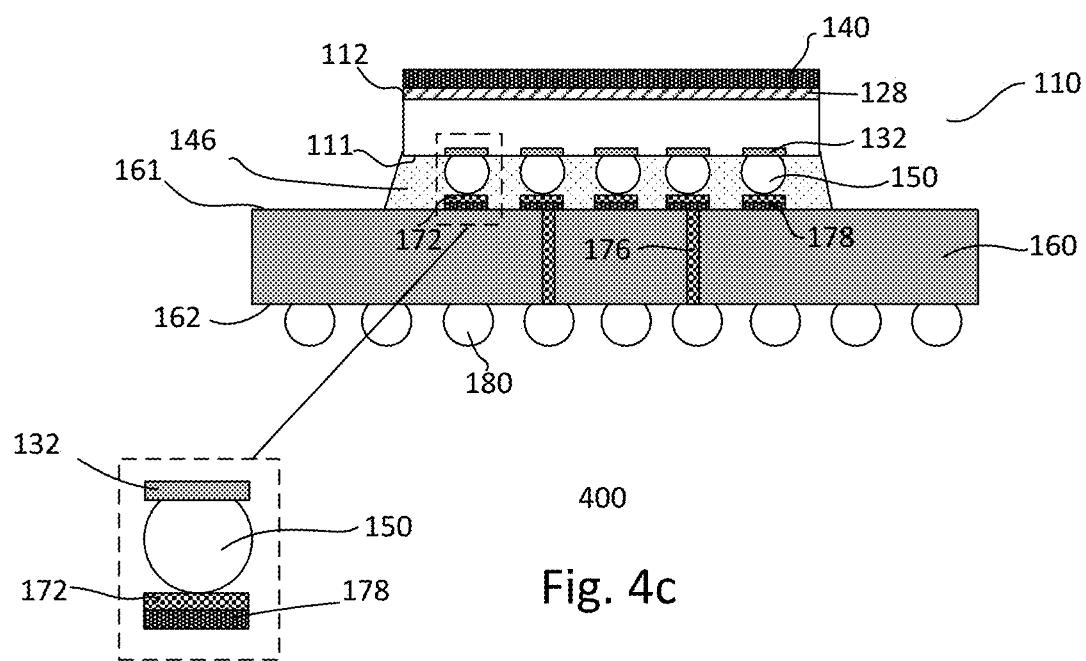

FIGS. 4*a*-4*c* show another embodiment of a process 400 for forming a MRAM assembly or package. The process 400, for example, may include similar processes as described in FIGS. 2*a*-2*e* or FIGS. 3*a*-3*f* and the MRAM assembly or package formed by process 400 is similar to the MRAM assembly 100*b* as described in FIG. 1*b*. Common elements, indicated by the same reference numerals, may not be described or described in detail. In the interest of brevity, the description of the process 400 below primarily focuses on the difference(s) compared with the process 200 or process 300.

Referring to FIG. 4*a*, a package substrate 160, similar to that described in FIG. 1*a* is provided. For example, the package substrate includes top and bottom surfaces 161 and 162 and a plurality of through-hole contacts 176 extend from the top to the bottom surface of the package substrate. The package substrate, for example, includes organic material, such as Bismaleimide Triazine (BT) or polyimide and the through-holes can be formed by various techniques including mechanical or laser drilling. The through-holes are filled with a conductive material including Cu or Cu alloy to form the through-hole contacts 176. Other suitable materials and forming techniques are also useful.

In one embodiment, the process 400 continues by providing a magnetic shield layer 478 over the top surface 161 of the package substrate. The magnetic shield layer, for example, includes, NiFe (Mμ metal) or electrical steel. Other suitable magnetic shield material which does not function by excluding a magnetic field from itself, but rather by collecting and concentrating the magnetic field lines into itself and thereby diverting the field from the magnetically sensitive components to be protected may also be used as the magnetic shield layer. The magnetic shield layer, for example, may have a thickness of about 100-300 μm formed by PVD over the top surface 161 of the package substrate. Alternatively, a combination of PVD and plating may be employed to form a thicker magnetic shield layer 478 over the top surface of the package substrate. Other suitable forming techniques and thicknesses for the magnetic shield layer may also be useful.

The process 400 continues to form a conductive layer 472 over the magnetic shield layer 478. The conductive layer, for example, includes a conductive material, including Cu. Other suitable conductive material may also be useful. The conductive layer, for example, may be formed over the magnetic shield layer by PVD or plating. Other suitable forming techniques may also be useful.

The process 400 continues by defining the conductive traces or package contact traces 172 and magnetic shield traces 178 on the top surface of the package substrate as shown in FIG. 4*b*. The conductive and magnetic shield layers, for example, are patterned in a desired pattern which are configured to match the conductive trace layout of the package substrate. In one embodiment, a patterned mask (not shown), such as a photoresist layer, may be formed over the conductive layer. An exposure source may selectively expose the photoresist layer through a reticle containing the desired pattern. After selectively exposing the photoresist layer, it is developed to form openings corresponding to locations where the conductive layer and magnetic shield layer are to be removed. To improve lithographic resolution, an anti-reflective coating (ARC) may be used below the photoresist layer. Portions of the conductive and magnetic shield layers exposed by the mask are removed by, for example, an anisotropic etch, such as reactive ion etching (RIE). A plurality of package balls 180 may be formed thereafter and are coupled to the bottom surface of the package substrate using suitable techniques.

The process 400 may continue by mounting an individual or singulated die 110 to the package substrate 160. The die, for example, may be formed by the process steps as described in FIGS. 2*a*-2*d* or FIGS. 3*a*-3*e*. In one embodiment, the die is mounted to the package substrate in such a way that the die microbumps 150 of the die are coupled to the top package contact traces 172 having magnetic shield traces 178 beneath the package contact traces as shown in FIG. 4*c*. In one embodiment, an underfill 146 is dispensed into the space between the active surface 111 of the die and the top surface 161 of package substrate. The steps of mounting the die to the package substrate and dispensing the underfill material are the same as that described in FIG. 2*e* and will not be repeated therein.

Figure 5A:
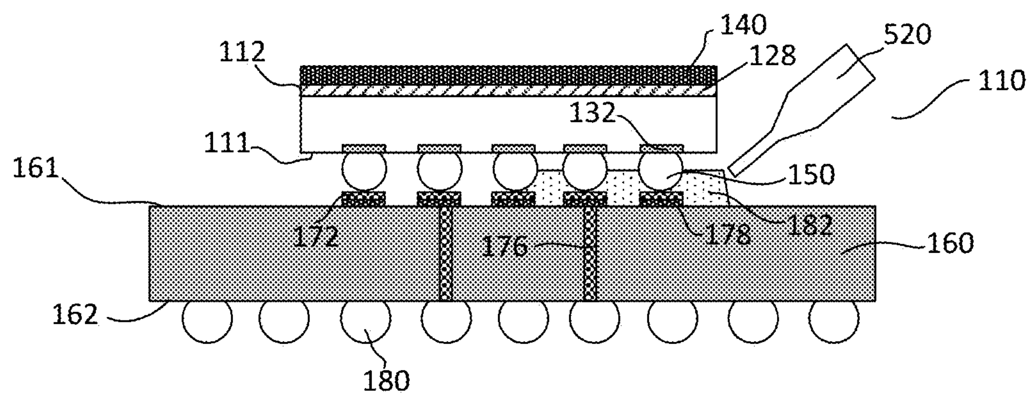
FIGS. 5*a*-5*b* show a further embodiment of a process for forming a MRAM package having a second bottom magnetic shield in the form of magnetic permeable underfill dielectric material, and also the top magnetic shield and the first bottom magnetic shield in the form of magnetic shield traces.
Figure 5B:
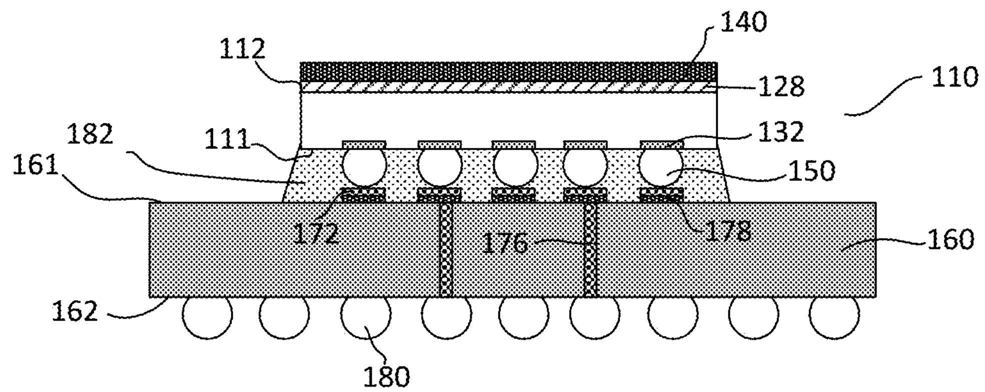

FIGS. 5*a*-5*b* show another embodiment of a process 500 for forming a MRAM assembly or package. The process 500, for example, may include similar processes as described in FIGS. 2*a*-2*e*, FIGS. 3*a*-3*f* and FIGS. 4*a*-4*c* and the MRAM assembly or package formed by process 500 is similar to the MRAM assembly 100*c* as described in FIG. 1*c*. Common elements, indicated by the same reference numerals, may not be described or described in detail. In the interest of brevity, the description of the process 400 below primarily focuses on the difference(s) compared with the process 200, process 300 and process 400.

Referring to FIG. 5*a*, the process 500 is at the stage similar to that described in FIG. 4*c*. For example, the die 110 having a magnetic shield layer 140 on the back side of the die is mounted to the package substrate 160 in such a way that the die microbumps 150 of the die are coupled to the top package contact traces 172 having magnetic shield traces 178 beneath the package contact traces.

The process 500 continues by providing an underfill material in the space between the bottom surface of the die and the top surface of the package substrate. In one embodiment, the process 500 differs from the process 400 in that a magnetic permeable underfill dielectric material 182 is provided in the space between the active surface of the die and the top surface of the package substrate as shown in FIG. 5*b*. The magnetic permeable underfill dielectric material 182, for example, may be provided by a dispenser 520. The permeability of magnetic material varies with the type of alloy and combination. Different materials have different saturation levels. For example, an iron/nickel compound typically has twice the constant relative permeability as mere iron. The permeability also varies with particle size generally diminishing with increasing particle size. For example, barium-ferrite nanoparticles $Ba(CoTi)_xFe_{12-2x}O_{19}$ or a silicon carbide filler such as ECCOSORB® DSF has higher purity crystalline and smaller particle size which gives higher permeability property and may be used as the magnetic permeable underfill dielectric material. Other suitable types of magnetic permeable underfill dielectric materials may also be useful.

FIGS. 6*a*-6*g* show another embodiment of a process 600 for forming a MRAM assembly or package. The process 600, for example, may include similar processes as described in FIGS. 2*a*-2*e*, FIGS. 3*a*-3*e*, FIGS. 4*a*-4*c* and FIGS. 5*a*-5*b* and the MRAM assembly or package formed by process 600 is similar to the MRAM assembly 100*d* as described in FIG. 1*d*. Common elements, indicated by the same reference numerals, may not be described or described in detail. In the interest of brevity, the description of the process 400 below primarily focuses on the difference(s) compared with the process 200, process 300, process 400 and process 500.

Figure 6A:
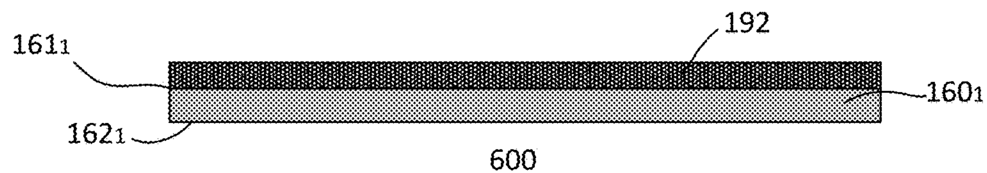
FIGS. 6$a$-6$g$ show another embodiment of a process for forming a MRAM package having a third bottom magnetic shield sandwiched between two thin package substrates, and also the top magnetic shield and the first/second bottom magnetic shield.
Figure 6B:
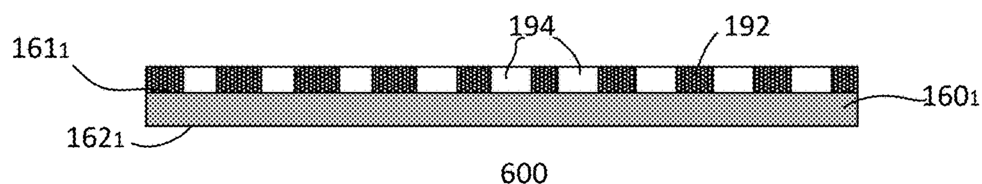

Referring to FIG. 6*a*, the process 600 commences by providing a first package substrate layer $\mathbf{160}_1$. The first package substrate layer may be a single-layered or a multi-layered package substrate layer. The first package substrate layer may be made of organic material, such as Bismaleimide Triazine (BT) or polyimide. Other suitable types of materials may also be employed for the first package substrate layer.

The first package substrate $\mathbf{160}_1$ includes first and second major surfaces $\mathbf{161}_1$ and $\mathbf{162}_1$. The first major surface $\mathbf{161}_1$, for example, may be referred to as the "top surface" while the second surface $\mathbf{162}_1$ may be referred to as the "bottom surface". Other designations of surfaces may also be useful. In one embodiment, the process 600 continues to provide a magnetic shield layer 192 over the first major surface $\mathbf{161}_1$ of the first package substrate layer. The magnetic shield layer, for example, includes, NiFe (Mμ metal) or electrical steel. Other suitable magnetic shield material which does not function by excluding a magnetic field from itself, but rather by collecting and concentrating the magnetic field lines into itself and thereby diverting the field from the magnetically sensitive components to be protected may also be used as the magnetic shield layer. The magnetic shield layer, for example, may include a thickness of about 100-300 μm formed by PVD. Alternatively, a combination of PVD and plating may be employed to form a thicker magnetic shield layer. Other suitable forming techniques and thicknesses for the magnetic shield layer may also be useful.

The process 600 continues by forming a plurality of via holes in the magnetic shield layer. For example, the plurality of via holes extend from the top surface to the bottom surface of the magnetic shield layer and may be formed using suitable etch and mask technique. For example, a soft mask, such as a photoresist layer, may be used. An exposure source may selectively expose the photoresist layer through a reticle containing the desired pattern. After selectively exposing the photoresist layer, it is developed to form openings corresponding to locations where the magnetic shield layer are to be removed. To improve lithographic resolution, an ARC may be used below the photoresist layer. Portions of the magnetic shield layer exposed by the mask are removed by, for example, an anisotropic etch, such as RIE. A dielectric layer may be provided over the magnetic shield layer and fills the via holes. The dielectric material, for example, includes $SiO_2$ and may be formed by CVD. Excess dielectric material may be removed by a planarization process, such as CMP, to produce a planar top surface between the magnetic shield layer and the dielectric vias 194. Other suitable dielectric materials and forming techniques may also be used.

Figure 6C:
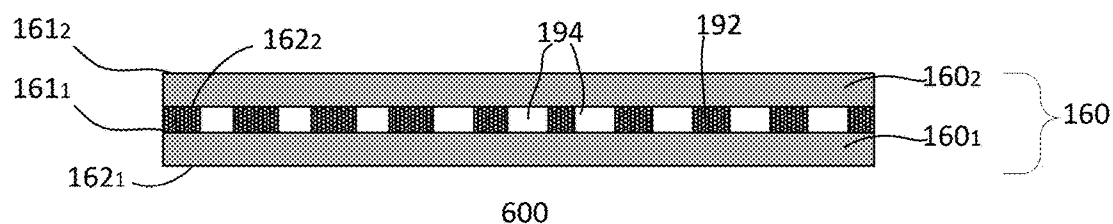

In FIG. 6*c*, a second package substrate layer $\mathbf{160}_2$ is provided. The second package substrate layer includes first and second major surfaces $\mathbf{161}_2$ and $\mathbf{162}_2$. The first major surface $\mathbf{161}_2$, for example, may be referred to as the "top surface" while the second surface $\mathbf{162}_2$ may be referred to as the "bottom surface" of the second package substrate layer. The second package substrate layer $\mathbf{160}_2$ may be made of the same or different material from the first package substrate layer $\mathbf{160}_1$. As shown, the second package substrate layer is provided over the magnetic shield layer where the second major surface $\mathbf{162}_2$ of the second package substrate layer is facing the magnetic shield layer. The second package substrate layer may be bonded to the first substrate layer with the magnetic shield layer there between using suitable bonding technique. As shown, the first and second package substrate layers and the magnetic shield layer in between these package substrate layers form the package substrate 160.

Figure 6D:
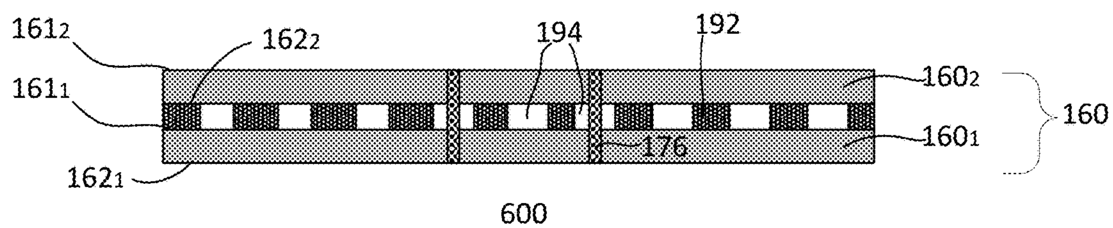

Referring to FIG. 6*d*, the process 600 continues to form through-hole contacts in the package substrate. A plurality of through-hole are formed in the package substrate. The through-hole can be formed by various techniques. Such techniques can include mechanical or laser drilling. Other suitable techniques are also useful. The through-holes, for example, extend from the top surface $\mathbf{161}_2$ of the second package substrate layer to the bottom surface $\mathbf{162}_1$ of the first package substrate layer and pass through the dielectric vias 194. The through-holes are filled with a conductive material. For example, the holes are filled with Cu or Cu alloy to form the through-hole contacts 176. Filling the through-holes with other suitable types of conductive materials is also useful. The through-holes, for example, may be filled by electroplating. The through-holes can also be filled using other filling techniques. As shown, the dielectric vias isolate the through-hole contacts from the magnetic shield layer to prevent electrical shorts.

Figure 6E:
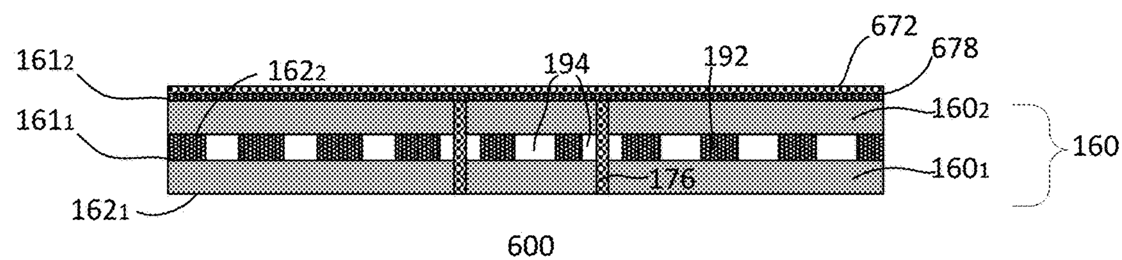
Figure 6F:
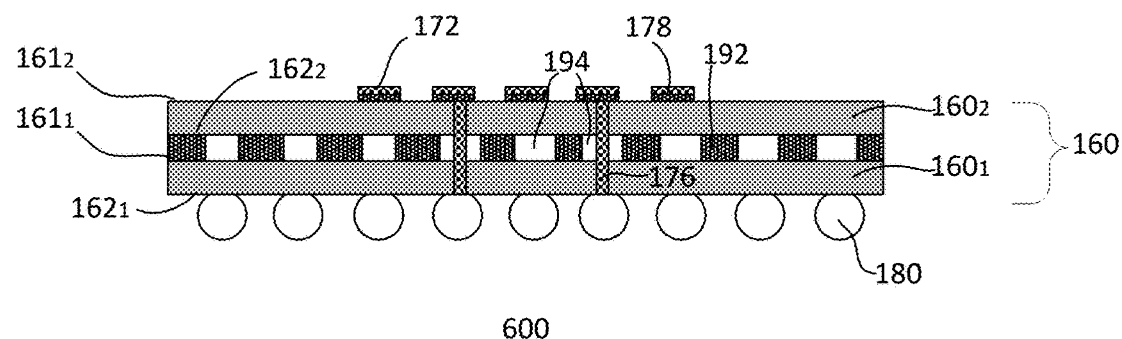

The process 600 continues by forming a magnetic shield layer 678 and a conductive layer 672 over the first major surface $\mathbf{161}_2$ of the second package substrate layer as shown in FIG. 6*e*. The magnetic shield layer 678 and the conductive layer 672 may include the same materials and formed by the same techniques as the layers 478 and 472 described in FIG. 4*a*. As shown in FIG. 6*f*, the layers 678 and 672 are then processed to form magnetic shield traces 178 and top package contact traces 172 on the top surface of the package substrate using suitable mask and etch techniques as described in FIG. 4*b*. Package balls 180 may be provided on the second major surface $\mathbf{162}_1$ of the first package substrate layer using suitable techniques. The package contacts 180, for example, are coupled to the through-hole contacts.

Figure 6G:
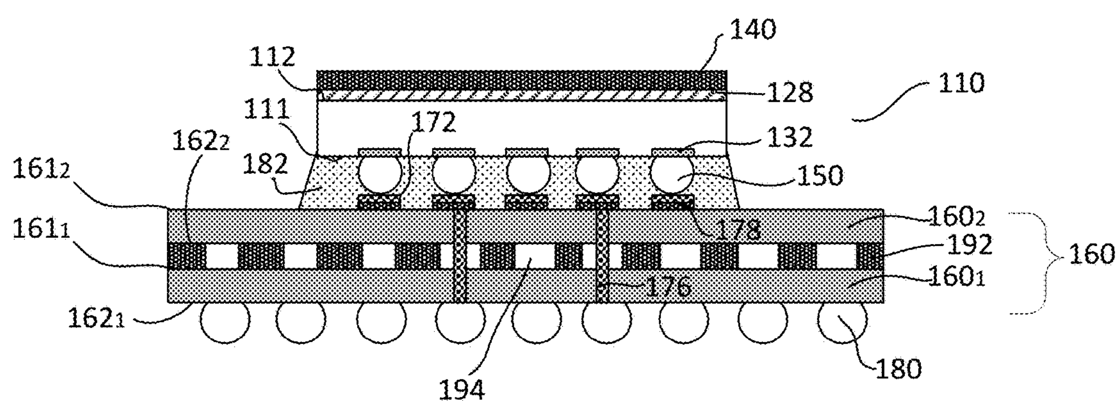

Referring to FIG. 6*g*, the process 600 continues by mounting a die 110 to the package substrate 160. The die, for example, is similar to the die formed by processes described FIGS. 2*a*-2*d* or FIGS. 3*a*-3*d* and is mounted in such a way that the die microbumps 150 of the die are coupled to the top package contact traces 172 having magnetic shield traces 178 beneath the package contact traces. Techniques for mounting the die is the same as that described in FIG. 5*b*.

The process 600 continues by providing an underfill material in the space between the bottom surface of the die and the top surface of the package substrate. In one embodiment, the process 600 may continue by providing an underfill material 146, similar to that described in FIG. 2*e*. Alternatively, the process 600 may continue by providing a magnetic permeable underfill dielectric material 182 in the space between the active surface of the die and the top surface of the package substrate, similar to that described and shown in FIG. 5*b*.

The MRAM assemblies or packages 100*a*-100*d* and the processes of forming a MRAM package as described in FIGS. 2*a*-2*e*, FIGS. 3*a*-3*f*, FIGS. 4*a*-4*c*, FIGS. 5*a*-5*b* and FIGS. 6*a*-6*g* result in various advantages. For example, the MRAM assemblies or packages as described have magnetic shield materials disposed on different locations of the assembly such as back side of a die, first surface of a package substrate, between the first surfaces of the die and the package substrate, or in between two package substrates layers. One or more magnetic shield dispositions and different combinations of the dispositions may be contemplated herein. For example, the process of FIGS. 6*a*-6*g* may be modified such that the MRAM package includes magnetic shield materials on the backside of the die and in between two package substrate layers. In such case, the step of providing the magnetic shield layer 678 may be omitted. Other process sequences or combinations are also useful. Furthermore, the disclosed methods of forming the magnetic shield packages are easy in fabrication, top magnetic shield 140 processed on the wafer level, low cost, and scalable.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A magnetic random access memory (MRAM) package comprising:

a package substrate having first and second major surfaces, wherein the package substrate comprises a plurality of through-hole contacts extend from the first to the second major surface of the package substrate;

package contact traces disposed on the first major surface and package balls are disposed on the second major surface of the package substrate, wherein the through-hole contacts couple the package contact traces and package balls on the first and second major surfaces of the package substrate; and a die, wherein the die comprises first and second opposing major surfaces, the first major surface is an active surface and the second major surface is an inactive surface, a magnetic storage element, a plurality of die microbumps disposed on the active surface, a top magnetic shield layer disposed only on the inactive surface of the die, a first bottom magnetic shield in the form of magnetic shield traces disposed under the package contact traces, wherein the magnetic shield traces are disposed in between the package contact traces and the first major surface of the package substrate, and a die attach region defined on the first major surface of the package substrate, wherein the die microbumps of the die are coupled to the package contact traces disposed on the first major surface of the package substrate.

2. The MRAM package of claim 1 wherein the top magnetic shield layer is separated by a dielectric layer from the inactive surface of the die.

3. The MRAM package of claim 1 comprising a second bottom magnetic shield in the form of a magnetic permeable underfill dielectric material disposed in a space between the active surface of the die and first major surface of the package substrate.

4. The MRAM package of claim 1 wherein the package substrate comprises:

a first package substrate layer, a second package substrate layer and a third bottom magnetic shield layer disposed in between the first and second package substrate layers, wherein the third bottom magnetic shield layer comprises a plurality of dielectric vias which extend from a top surface to a bottom surface of the third bottom magnetic shield layer and the through-hole contacts pass through the dielectric vias.

5. A method of forming a magnetic random access memory (MRAM) package comprising:

providing a package substrate having first and second major surfaces, wherein the package substrate comprises a plurality of through-hole contacts extend from the first to the second major surface of the package substrate;

forming package contact traces on the first major surface and forming package balls on the second major surface of the package substrate, wherein the through-hole contacts couple the package contact traces and package balls on the first and second major surfaces of the package substrate;

providing a die having active and inactive surfaces, wherein the die comprises a magnetic storage element formed in the die, a plurality of die microbumps formed on the active surface and a top magnetic shield layer formed on the inactive surface of the die;

forming a first bottom magnetic shield in the form of magnetic shield traces under the package contact traces, wherein the magnetic shield traces are formed in between the package contact traces and the first major surface of the package substrate; and mounting the die to a die attach region defined on the first major surface of the package substrate, wherein the die microbumps of the die are coupled to the package contact traces formed on the first major surface of the package substrate.

6. The method of claim 5 wherein the top magnetic shield layer is separated by a dielectric layer from the inactive surface of the die.

7. The method of claim 6 wherein the top magnetic shield layer comprises a top magnetic shield material which does not function by excluding a magnetic field from itself, but rather by collecting and concentrating the magnetic field lines into itself and thereby diverting the field from the magnetic storage element.

8. The method of claim 7 wherein the top magnetic shield material comprises NiFe (Mμ metal) or electrical steel.

9. The method of claim 7 wherein the dielectric layer comprises an adhesive or silicon nitride.

10. The method of claim 5 comprising providing an underfill in a space between the active surface of the die and first major surface of the package substrate.

11. The method of claim 10 wherein providing the underfill comprises providing a second bottom magnetic shield in the form of a magnetic permeable underfill dielectric material.

12. The method of claim 11 wherein the magnetic permeable underfill dielectric material comprises barium-ferrite nanoparticles $Ba(CoTi)_X\ Fe_{12-2X}O_{19}$ or a silicon carbide filler.

13. The method of claim 11 wherein the package substrate comprises:

a first package substrate layer, a second package substrate layer and a third bottom magnetic shield layer formed in between the first and second package substrate layers, wherein the third bottom magnetic shield layer comprises a plurality of dielectric vias which extend from a top surface to a bottom surface of the third bottom magnetic shield layer and the through-hole contacts pass through the dielectric vias.

14. The method of claim 13 wherein the top magnetic shield layer and the third bottom magnetic shield layer comprise the same magnetic shield material.

15. A method for forming a magnetic random access memory (MRAM) package comprising:

providing a wafer having first and second major surfaces, the first major surface is an active surface and the second opposing major surface is an inaction surface, wherein the wafer is includes a plurality of dies having magnetic storage elements therein, a magnetic shield on the inactive surface of the wafer, and a plurality of die microbumps disposed on the active surface of the wafer;

processing the wafer, wherein processing the wafer comprises separating the wafer into a plurality of individual dies, wherein an individual die comprises active and inactive surfaces, the die microbumps are formed on the active surface of the die, and a top magnetic shield layer formed on the inactive surface of the die;

providing a package substrate having first and second major package surfaces, wherein the package substrate comprises a plurality of through-hole contacts extend from the first to the second major surface of the package substrate;

forming package contact traces on the first major surface and forming package balls on the second major surface of the package substrate, wherein the through-hole contacts couple the package contact traces and the package balls on the first and second major surfaces of the package substrate;

forming a first bottom magnetic shield in the form of magnetic shield traces under the package contact traces, wherein the magnetic shield traces are formed in between the package contact traces and the first major surface of the package substrate; and mounting the die to a die attach region defined on the first major surface of the package substrate, wherein the die microbumps of the die are coupled to the package contact traces formed on the first major surface of the package substrate, and the top magnetic shield layer is disposed only on the second major surface of the die which is the opposite major surface of the first major surface with the microbumps.

16. The method of claim 15 wherein processing the wafer comprising:

forming a dielectric layer over the second major surface of the wafer; and forming the top magnetic shield layer over the second major surface of the wafer, wherein the top magnetic shield layer is separated from the second major surface of the wafer by the dielectric layer, and wherein separating the wafer is performed after forming the top magnetic shield layer over the second major surface of the wafer.

17. The method of claim 15 wherein processing the wafer comprising:

forming a dielectric layer over the second major surface of the wafer; and forming the top magnetic shield layer over the inactive surface of the die, wherein separating the wafer is performed before forming the top magnetic shield layer over the inactive surface of the die.

18. The method of claim 15 wherein forming the first bottom magnetic shield in the form of magnetic shield traces under the package contact traces comprising:

forming a first bottom magnetic shield layer over the first major surface of the package substrate;

forming a conductive layer over the first bottom magnetic shield layer; and patterning the first bottom magnetic shield layer and the conductive layer to define the first bottom magnetic shield in the form of magnetic shield traces and the package contact traces on the first major surface of the package substrate.

19. The method of claim 15 wherein providing the package substrate comprises:

providing a first package substrate layer;

providing a second package substrate layer;

forming a third bottom magnetic shield layer in between the first and second package substrate layers;

forming a plurality of via holes in the third bottom magnetic shield layer;

filling the plurality of via holes with a dielectric material to form a plurality of dielectric vias;

forming a plurality of through-holes which extend from a top surface of the second package substrate layer to a bottom surface of the first substrate layer and pass through the dielectric vias; and filling the plurality of through-holes to form the through-hole contacts.

* * * * *